United States Patent
Ke et al.

(10) Patent No.: US 10,950,433 B2
(45) Date of Patent: Mar. 16, 2021

(54) METHODS FOR ENHANCING SELECTIVITY IN SAM-BASED SELECTIVE DEPOSITION

(71) Applicant: Applied Materials, Inc., Santa Clara, CA (US)

(72) Inventors: Chang Ke, Sunnyvale, CA (US); Michael S. Jackson, Sunnyvale, CA (US); Liqi Wu, San Jose, CA (US); Lei Zhou, San Jose, CA (US); Shuyi Zhang, San Jose, CA (US); David Thompson, San Jose, CA (US); Paul F. Ma, Santa Clara, CA (US); Biao Liu, San Jose, CA (US); Cheng Pan, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/193,594

(22) Filed: Nov. 16, 2018

(65) Prior Publication Data

US 2019/0157079 A1    May 23, 2019

Related U.S. Application Data

(60) Provisional application No. 62/588,347, filed on Nov. 18, 2017.

(51) Int. Cl.
| | |
|---|---|
| *H01L 21/02* | (2006.01) |
| *C23C 16/02* | (2006.01) |
| *C23C 16/56* | (2006.01) |
| *H01L 21/3105* | (2006.01) |
| *H01L 21/32* | (2006.01) |

(52) U.S. Cl.
CPC .... *H01L 21/02301* (2013.01); *C23C 16/0272* (2013.01); *C23C 16/56* (2013.01); *H01L 21/0228* (2013.01); *H01L 21/02315* (2013.01); *H01L 21/02323* (2013.01); *H01L 21/3105* (2013.01); *H01L 21/0229* (2013.01); *H01L 21/32* (2013.01)

(58) Field of Classification Search
CPC combination set(s) only.
See application file for complete search history.

(56) References Cited

U.S. PATENT DOCUMENTS

| | | | | |
|---|---|---|---|---|
| 2008/0116481 | A1* | 5/2008 | Sharma | H01L 21/76825 257/175 |
| 2015/0232992 | A1* | 8/2015 | Kim | C23C 16/401 427/553 |

OTHER PUBLICATIONS

Lee, Han-Bo-Ram, et al., "Degradation of the Deposition Blocking Layer During Area-Selective Plasma-Enhanced Atomic Layer Deposition of Cobalt", Journal of the Korean Physical Society, vol. 56, No. 1, Jan. 2010,, 104-107.

(Continued)

*Primary Examiner* — Ratisha Mehta
(74) *Attorney, Agent, or Firm* — Servilla Whitney LLC

(57) ABSTRACT

Methods of improved selectively for SAM-based selective depositions are described. Some of the methods include forming a SAM on a second surface and a carbonized layer on the first surface. The substrate is exposed to an oxygenating agent to remove the carbonized layer from the first surface, and a film is deposited on the first surface over the protected second surface. Some of the methods include overdosing a SAM molecule to form a SAM layer and SAM agglomerates, depositing a film, removing the agglomerates, reforming the SAM layer and redepositing the film.

11 Claims, 4 Drawing Sheets

(56) References Cited

OTHER PUBLICATIONS

Shaheen, A., et al., "Characterization of Self-Assembled Monolayers on a Ruthenium Surface", American Chemical Society, 6419-6426.

Shin, Hyunjung, et al., "Pyrolysis of self-assembled organic monolayers on oxide substrates", Journal of Material Research Society, vol. 14, No. 5, Jan. 14, 1999, 2116-2123.

* cited by examiner

METHODS FOR ENHANCING SELECTIVITY IN SAM-BASED SELECTIVE DEPOSITION

CROSS-REFERENCE TO RELATED APPLICATIONS

This application claims priority to U.S. Provisional Application No. 62/588,347, filed Nov. 18, 2017, the entire disclosure of which is hereby incorporated by reference herein.

FIELD

Embodiments of the disclosure generally relate to methods of enhancing selectivity in self-assembled monolayer (SAM) based selective depositions. More particularly, some embodiments of the disclosure are directed to methods of enhancing selectivity in self-assembled monolayer (SAM) based selective depositions which utilize oxygenating environments to remove a carbonaceous layer. Additionally, some embodiments of the disclosure are directed to methods of enhancing selectivity in self-assembled monolayer (SAM) based selective depositions which utilize alternating SAM deposition and removal.

BACKGROUND

As the design of semiconductor devices evolve, precision material manufacturing in the semiconductor industry has entered an era of atomic scale dimensions. At the atomic scale, with only tens of atoms at stake, there is no margin for error, i.e., every atom matters. This unprecedented challenge demands new material processing techniques which have atomic level precisions. However, increasing complexity of the process flow required in atomic scale device manufacturing can significantly increase the cost of manufacturing.

Selective deposition technology offers the potential for chemically-selective atomic-layer precision in semiconductor film patterning. Selective deposition also offers the potential for simpler process flows by eliminating lithography or other process steps.

One form of selective deposition, based on long-chain carbon-based self-assembled monolayers (SAMs), has been proposed as a method for depositing a sacrificial layer in various selective deposition schemes. A feature of selective deposition process flows based on SAMs is the degree to which a high-quality SAM can be grown on part of the structure (e.g. dielectric surfaces) without depositing any SAM on the other part of the structure (e.g. metal surfaces).

To achieve atomic level material processing and maintain low cost at the same time, a self-assembled monolayer (SAM) based selective deposition technique has been developed. The technique combines the selectivity of SAM and ultra-high precision of atomic layer deposition (ALD) providing chemically-selective atomic-layer precision in semiconductor film patterning with a fundamentally simplified process flow, i.e., with high precision and low cost.

In the selective deposition flow, long-chain carbon-based SAM serves as a sacrificial layer which forms closely packed monolayer on part of the structure (e.g. dielectric films) leaving the other part of the structure untouched (e.g. metal films). Accordingly the quality of SAM film, i.e. high SAM molecular packing density on dielectric and low unwanted SAM agglomerates landed on metal, is used to achieve high quality selectively deposited ALD films.

However the SAM packing density and agglomerates compete in regular SAM deposition process. For example, a highly densified SAM film is prone to having high amounts of SAM agglomerates. As a consequence, the final ALD film could have voids or the dielectric area could have unwanted ALD deposition. Therefore, there is a need for a method to achieve high SAM density and minimize or eliminate SAM agglomerate to enable the high quality growth of subsequent ALD layer.

Additionally, SAM molecules deposited on unwanted areas of the structure can substantially degrade the quality of electrical devices formed by depositing films over these unwanted SAMs. Having a high degree of differentiation between the areas where SAM adsorption is targeted is a factor in the success of this integration flow. Therefore, methods are needed to clean the area where unwanted SAM has been deposited and enable the high quality growth of a subsequent layer.

SUMMARY

One or more embodiments of the disclosure are directed to methods for selective deposition. The methods comprise providing a patterned substrate comprising a first metal surface and a second dielectric surface. The patterned substrate is exposed to a SAM molecule to form a protected second surface and a carbonized layer on the first surface. The patterned substrate is exposed to an oxygenating agent to remove the carbonized layer from the first surface. The substrate is exposed to a plurality of reactants separately to selectively deposit a film on the first surface over the protected second surface.

Further embodiments of the disclosure are directed to methods of selective deposition. The methods comprise providing a patterned substrate comprising a first metal surface and a second dielectric surface. The patterned substrate is exposed to a first SAM molecule to form a first SAM layer on the second surface and first SAM agglomerates on the substrate. The substrate is exposed to a plurality of reactants separately to selectively deposit a dielectric layer on the first surface over the second surface. The first SAM layer is removed from the second surface. The first SAM agglomerates are removed from the substrate. The substrate is exposed to a second SAM molecule to form a second SAM layer on the dielectric layer and the second surface and second SAM agglomerates on the substrate. The substrate is sequentially exposed to a plurality of reactants to selectively deposit a dielectric layer on the first surface over the second surface and the dielectric layer.

Further embodiments of the disclosure are directed to methods of selective deposition. The methods comprise providing a patterned substrate comprising a first metal surface comprising ruthenium or cobalt and a second dielectric surface. The patterned substrate is exposed to a SAM molecule to form a protected second surface and a carbonized layer on the first surface. The patterned substrate is exposed to oxygen gas at a temperature in the range of about 250° C. to about 300° C. for a period in the range of about 30 seconds to about 2 minutes to remove the carbonized layer from the first surface. The substrate is exposed to a plurality of reactants to selectively deposit a dielectric material on the first surface over the second surface.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the invention may admit to other equally effective embodiments.

DETAILED DESCRIPTION

Figure 1:
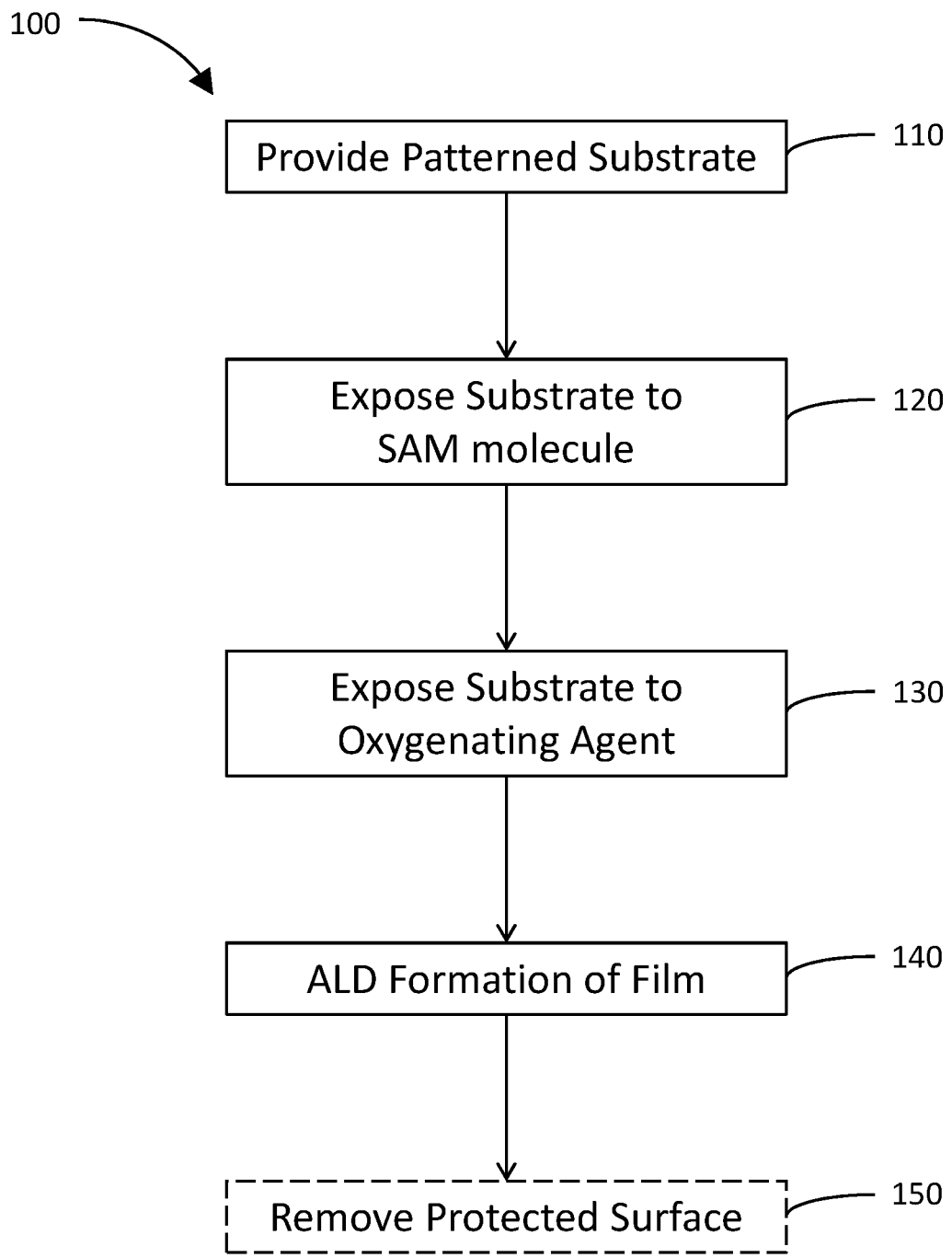
FIG. 1 illustrates a processing method in accordance with one or more embodiment of the disclosure.

As used in this specification and the appended claims, the term "substrate" and "wafer" are used interchangeably, both referring to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon.

Further, a "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate (or otherwise generate or graft target chemical moieties to impart chemical functionality), anneal and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface. What a given substrate surface comprises will depend on what films are to be deposited, as well as the particular chemistry used. As used herein, a "patterned substrate" refers to a substrate with a plurality of different material surfaces. In some embodiments, a patterned substrate comprises a first surface and a second surface. In some embodiments, the first surface is a metal surface and the second surface is a dielectric surface.

As used in this specification and the appended claims, the terms "reactive gas", "process gas", "precursor", "reactant", and the like, are used interchangeably to mean a gas that includes a species which is reactive with a substrate surface. For example, a first "reactive gas" may simply adsorb onto the surface of a substrate and be available for further chemical reaction with a second reactive gas.

Embodiments of the disclosure provide methods of enhancing SAM-based selective depositions. As used in this specification and the appended claims, the term "selectively depositing a film on one surface over another surface", and the like, means that a first amount of the film is deposited on the first surface and a second amount of film is deposited on the second surface, where the second amount of film is less than the first amount of film, or no film is deposited on the second surface. The term "over" used in this regard does not imply a physical orientation of one surface on top of another surface, rather a relationship of the thermodynamic or kinetic properties of the chemical reaction with one surface relative to the other surface. For example, selectively depositing a cobalt film onto a copper surface over a dielectric surface means that the cobalt film deposits on the copper surface and less or no cobalt film deposits on the dielectric surface; or that the formation of the cobalt film on the copper surface is thermodynamically or kinetically favorable relative to the formation of a cobalt film on the dielectric surface.

One strategy to achieve selective deposition employs the use of blocking layers. Ideally, this strategy involves (1) formation of a blocking layer on substrate materials on which deposition is to be avoided with negligible impact to the target substrate material, (2) deposition on the target substrate material (where deposition on other substrate materials is "blocked" by the blocking layer), and (3) optional removal of the blocking layer without net adverse effects to the deposited film.

Embodiments of the disclosure incorporate a blocking layer typically referred to as a self-assembled monolayer (SAM). A self-assembled monolayer (SAM) consists of an ordered arrangement of spontaneously assembled organic molecules (SAM molecules) adsorbed on a surface. These molecules are typically comprised of one or more moieties with an affinity for the substrate (head group) and a relatively long, inert, linear hydrocarbon moiety (tail group). SAM molecules are fundamentally a surfactant which has a hydrophilic functional head with a hydrophobic carbon chain tail.

SAM formation happens through fast adsorption of molecular head groups at the surface and slow association of molecular tail groups with each other through van der Waals interactions. SAM precursors are chosen such that the head group selectively reacts with the substrate materials to be blocked during deposition. Deposition is then performed, and the SAMs can be removed through thermal decomposition (with desorption of any byproducts) or an integration-compatible ashing process.

A representative process flow for selective deposition includes a) providing a patterned substrate, b) growing a SAM (either by CVD, ALD, or immersion), and c) selective atomic layer deposition (ALD) of a film. In the representative process flow, the SAM is used as a sacrificial layer to enable the selective ALD deposition.

In an ideal scenario, a patterned surface has a dielectric surface fully covered by SAM and the metal area is left untouched. However, deposition of SAMs on dielectric layers frequently uses process conditions (e.g. elevated temperature or high fluxes) which may result in unwanted adsorption of SAM molecules on metal surfaces. The adsorption process becomes more probable for catalytically reactive metals, e.g. ruthenium and cobalt. In these process flows, the SAM molecules react to give a carbonized layer on the top of metal, which causes degradation of films deposited over these SAM-based contaminants in subsequent steps. Additionally, the existence of this interfacial layer reduces the adhesion between deposited films and the metal surface.

The inventors have found that there is a measurable difference in atomic force microscopy (AFM) roughness of deposited films between wafers treated with SAM molecules before deposition and those not treated with SAM molecules. Transmission Electron Microscopy (TEM) was used to collect high resolution interface images and element maps (through use of the Electron Energy Loss Spectroscopy (EELS) function of TEM). In reviewing the TEM images, a thin interfacial layer (~1 nm) was found between the ALD deposited layer and the SAM treated metal surface. The ALD deposited layer on top of the stack had granular growth and a rough surface. In addition, the element map revealed that the interfacial layer contained high amounts of carbon, implicating a reaction between SAM molecules and the metal surface during the SAM deposition process.

Without being bound by theory, it is believed that the formation of a carbonized layer on the surface of metal leads to the low-quality growth of the ALD dielectric film grown on this metal. Therefore, removal of this carbonized layer is critical to enable the growth of subsequent high-quality ALD films.

Another constraint is that the methodology for removal of unwanted SAM on metals should not affect, or should minimally affect the integrity of the SAM film on the dielectrics. Some embodiments of the disclosure are directed to methods of selective catalytic oxidation of the carbon layer, where the oxidizing flux, wafer treatment temperature and treatment duration are deliberately controlled to optimize SAM removal from metals without impacting the integrity of the SAM layer on the dielectric film.

Without being bound by theory, it is believed that some embodiments use selective surface catalytic chemistry to decompose molecular oxygen to reactive species adsorbed on the metal surface, and can react with and remove any adsorbed carbonaceous species.

TEM and EELS were used again to investigate the interface between the ALD deposited layer and the metal surface for samples going through the new process flow. From the TEM image, it was very clear that the interfacial carbon layer is substantially reduced in the new process. EELS elemental mapping also shows a substantial reduction in the thickness of the carbon-based interfacial layer between the ALD deposited layer and the metal surface. The ALD deposited layer also showed a smoother surface and much less granularity.

To further confirm the effect of new process flow, top-down scanning electron microscopy (SEM) was used to investigate the morphology of the ALD films deposited on both blanket metal substrates and patterned substrates (which include alternating metal and dielectric areas). A large number of voids were seen on the ALD deposited film deposited on the treated metal surface, which implies a low film quality. A void-free film was seen for the ALD deposited film deposited on the treated metal surface which was processed through the disclosed method before ALD deposition. Granular, broken and porous ALD film lines are observed on the traditional process patterned wafer. The sample with the SAM removal step in the process flow gave notably smoother ALD film lines on the patterned wafer.

Figure 2:
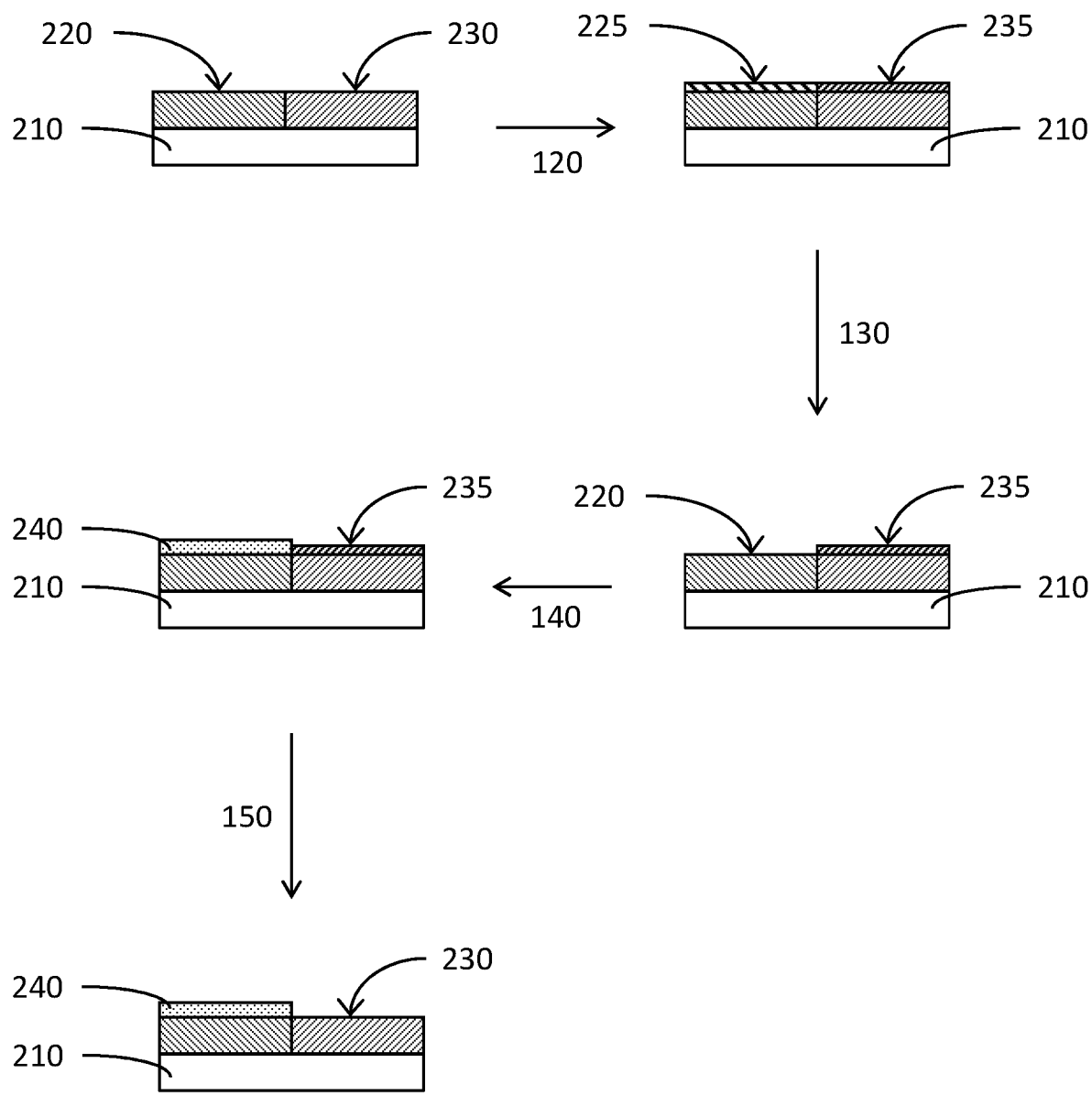
FIG. 2 illustrates a cross sectional view of a substrate as processed through a method in accordance with one or more embodiment of the disclosure.

Referring to FIG. 1, one or more embodiment of the disclosure is directed to a processing method 100 for selective deposition. Referring to FIG. 2, a cross-sectional view of a substrate 210 is shown as it is processed through the processing method 100. At 110, a substrate 210 is provided.

The substrate 210 comprises a first surface 220 and a second surface 230. The substrate 210 comprising the first surface 220 and the second surface 230 may also be referred to as a patterned substrate. As used herein, a "patterned substrate" is a substrate comprising at least two different exposed material surfaces. The term "patterned substrate" should not be understood to imply any specific arrangement or repetition of the exposed material surfaces.

The first surface 220 may be comprised of any suitable atomic metal, metal alloy or other conductor. The first surface 220 may also be referred to as a first metal surface. In some embodiments, the first surface 220 comprises a catalytically reactive metal. In some embodiments, the first surface 220 comprises one or more of ruthenium or cobalt. In some embodiments, the first surface 220 consists essentially of ruthenium. In some embodiments, the first surface 220 consists essentially of cobalt.

As used in this specification and the appended claims, the term "consists essentially of" means that greater than or equal to about 95%, about 98% or about 99% of the specified material is the stated material.

The second surface 230 may be comprised of any suitable dielectric material. The second surface 230 may also be referred to as a second dielectric surface.

Next, at 120 the substrate 210 is exposed to a SAM molecule (not shown) to form a protected second surface 235 and a carbonized layer 225 on the first surface 220.

The SAM molecule may be any suitable chemical species capable of forming a SAM on the second surface 230. The SAM formed on the second surface 230 is also referred to as a protected second surface 235.

The substrate 210 may be exposed to the SAM molecule by any suitable process. In some embodiments, the substrate 210 is exposed to the SAM molecule by a chemical vapor deposition (CVD) process. In some embodiments, the substrate 210 is exposed to the SAM molecule by an ALD process. In some embodiments, the substrate 210 is exposed to the SAM molecule by an immersion or "wet" process.

The process conditions required for the formation of the protected second surface 235 often lead to adsorption of SAM molecules on the first surface 220. These SAM molecules react to form a carbonized layer 225 on the first surface 220. Without being bound by theory, it is believed that the presence of catalytically reactive metals within the first surface 220 makes the unwanted adsorption of SAM molecules are their reaction to form a carbonized layer 225 on the first surface 220 more likely.

At 130, the substrate 210 is exposed to an oxygenating agent (not pictured) to remove the carbonized layer 225 from the first surface 220.

The oxygenating agent may be any suitable oxygenating agent to remove the carbonized layer 225 from the first surface 220. In some embodiments, the oxygenating agent comprises one or more of oxygen, ozone or water. In some embodiments, the oxygenating agent consists essentially of oxygen. In some embodiments, the oxygenating agent does not comprise a plasma. Without being bound by theory, it is believed that the use of a plasma to remove the carbonized layer would also have a detrimental effect on the protected second surface 235.

In some embodiments, exposing the substrate 210 to the oxygenating agent does not substantially affect the integrity of the protected second surface 235. The integrity of the protected second surface can be measured by water contact angle (WCA). In general SAMs have a low WCA, indicating a hydrophobic surface. As the integrity of the SAM declines, the WCA increases. For the purposes of this disclosure, "substantially" affecting the integrity of the protected second surface 235 means that the WCA is not changed by more than 10° or 5°.

In some embodiments, one or more process conditions (temperature, pressure, flow rate of the oxygenating agent and exposure time) may be controlled. In some embodiments, the temperature of the substrate 210 may be held at a temperature in the range of about 100° C. to about 350° C., or about 200° C. to about 325° C., or about 250° C. to about 300° C. In some embodiments, the temperature of the substrate 210 may be held at a temperature less than or equal to about 350° C., about 325° C., about 300° C., about 275° C., about 250° C., about 200° C., or about 150° C. In some embodiments, the temperature of the substrate 210 may be held at a temperature greater than or equal to about 100° C., about 150° C., about 200° C., about 250° C., about 275° C., about 300° C., or about 325° C. In some embodiments, the temperature of the substrate 210 may be held at a temperature of about 275° C.

In some embodiments, the exposure period is in a range of about 30 seconds to about 10 minutes, or about 45 seconds to about 5 minutes, or about 1 minute to about 3 minutes, or about 30 seconds to about 2 minutes. In some embodiments, the exposure period is greater than or equal to about 30 seconds, about 45 seconds, about 1 minute, about 2 minutes, or about 5 minutes. In some embodiments, the exposure time is less than or equal to about 10 minutes, about 5 minutes, about 2 minutes, about 1 minute or about 45 seconds. In some embodiments, the exposure time is about 1 minute.

At 140, the substrate is exposed to a plurality of reactants separately to selectively deposit a film 240 on the first surface 220 over the second surface 230. In some embodiments, the plurality of reactants is separated temporally. In some embodiments, the plurality of reactants is separated spatially. In some embodiments, the film 240 comprises a dielectric film.

In atomic layer deposition type chambers, the substrate can be exposed to the first and second precursors by either spatially or temporally separated processes. Temporal ALD is a traditional process in which the first precursor flows into the chamber to react with the surface. The first precursor is purged from the chamber before flowing the second precursor. In spatial ALD, both the first and second precursors are simultaneously flowed to the chamber but are separated spatially so that there is a region between the flows that prevents mixing of the precursors. In spatial ALD, the substrate is moved relative to the gas distribution plate, or vice-versa.

In some embodiments, at 150, the protected second surface 235 may be removed to expose the second surface 230. The protected second surface 235 may be removed by any suitable process, including but not limited to ashing processes, plasma process or chemical processes.

Since the selective absorption of SAM enables the subsequent selective ALD deposition, an ideal SAM layer should be well-packed on dielectric surface and leaving nothing on the metal area. However, the high packing density of SAM molecules always comes at the cost of potentially generating non-selective SAM agglomerates. Different from the SAM molecules, the SAM agglomerates are collections of SAM molecules which group together and are unable to orderly pack on the substrate. They land on both dielectric and metal surfaces due to the lack of selectivity. Subsequent ALD deposition is blocked by the agglomerates which causes voids in the ALD film. For purposes of this disclosure, these issues are Type I defects.

SAM agglomerates can be mitigated by reducing the SAM dosage. However, the packing density degrades as the SAM dosage goes down. Pinholes appear in the deposited SAMs due to the low SAM dosage. These pinholes become nucleation centers for the ALD growth in the following depositions. As a result, Type II defects are formed on the surface of dielectric. Given these defects, the device will suffer either short circuit or broken circuit issue.

These two types of defects compete with each other in the process of SAM film growth. This means that the likelihood of one of them increases as the likelihood of the other decreases. Ideally a process would produce low counts for both Type I and Type II defects.

In order to provide such a SAM process, a dual-stack process flow is disclosed herein. This unique process flow starts from an overdosed SAM film. The SAM film on the dielectric surface is highly densified and SAM agglomerates randomly and non-selectively land on the wafer surface. The ALD film is preferentially deposited on the metal surface of the wafer. Due to the existence of the SAM agglomerates, voids in the ALD film are present. The SAM is removed from the dielectric surface. The SAM agglomerates are removed through an ashing process. The dielectric surface is cleaned and the voids in the ALD film are exposed. Another overdosed SAM growth is formed on the dielectric surface and the ALD film. It is the same as the first layer of overdosed SAM, in that the entire dielectric surface is covered by well-packed SAM and SAM agglomerates randomly fall on the wafer. The voids in the ALD film are still exposed since the bottom of the voids is metal. A second ALD film deposition is performed. The voids in the first ALD film are filled. Once again, the SAM and the SAM agglomerates are removed. After this, a void-free ALD film is achieved. The critical assumption for this dual-stack flow to work effectively is that the SAM agglomerates generated in second SAM deposition do not land on the same locations of the first SAM agglomerates.

To validate this assumption, the probability of overlap (p_overlap) of the two SAM agglomerates appearing on the same location is given by:

$$p\_overlap = (d^2/D^2) \times N^2$$

where $N=10^6$ is the assumed SAM agglomerates count. This assumed count is one order of magnitude higher than typical agglomerate count seen in experimental data, $d=50$ nm is the typical SAM agglomerate diameter from SEM analysis, $D=300$ mm is the diameter of 12" wafer. Using these numbers, the p_overlap is calculated to be 0.03, which means the number of overlapped agglomerates on a full 12" wafer is 0.03. Statistically, this is negligible.

To further confirm the effectiveness of the dual-stack flow, top-down SEM was used to compare a patterned wafer surface which went through traditional process flows and the disclosed process flows respectively. The disclosed process shows clear advantages in getting higher quality selective deposition, i.e. no voids in the ALD lines.

Figure 3:
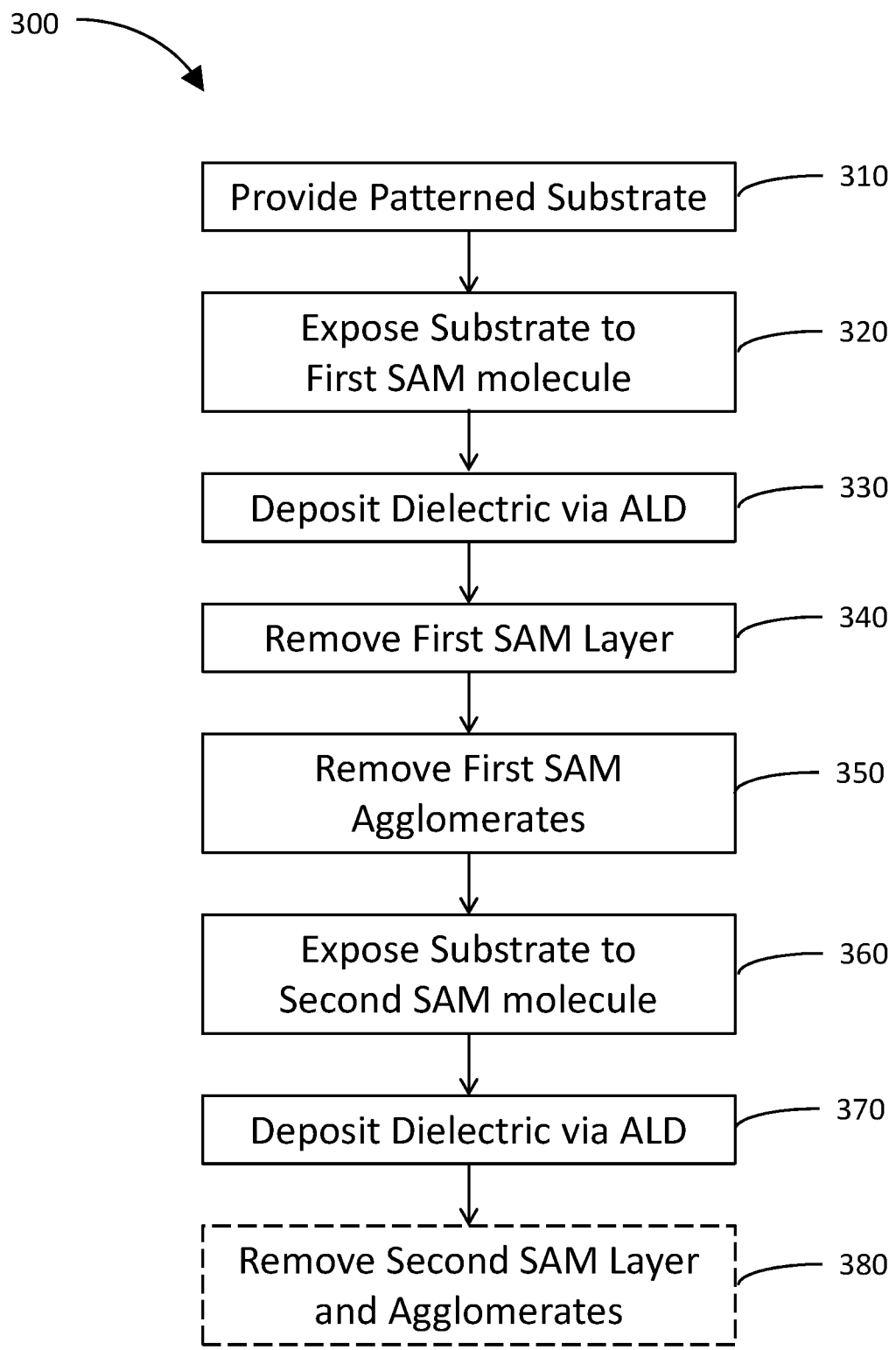
FIG. 3 illustrates a processing method in accordance with one or more embodiment of the disclosure.
Figure 4:
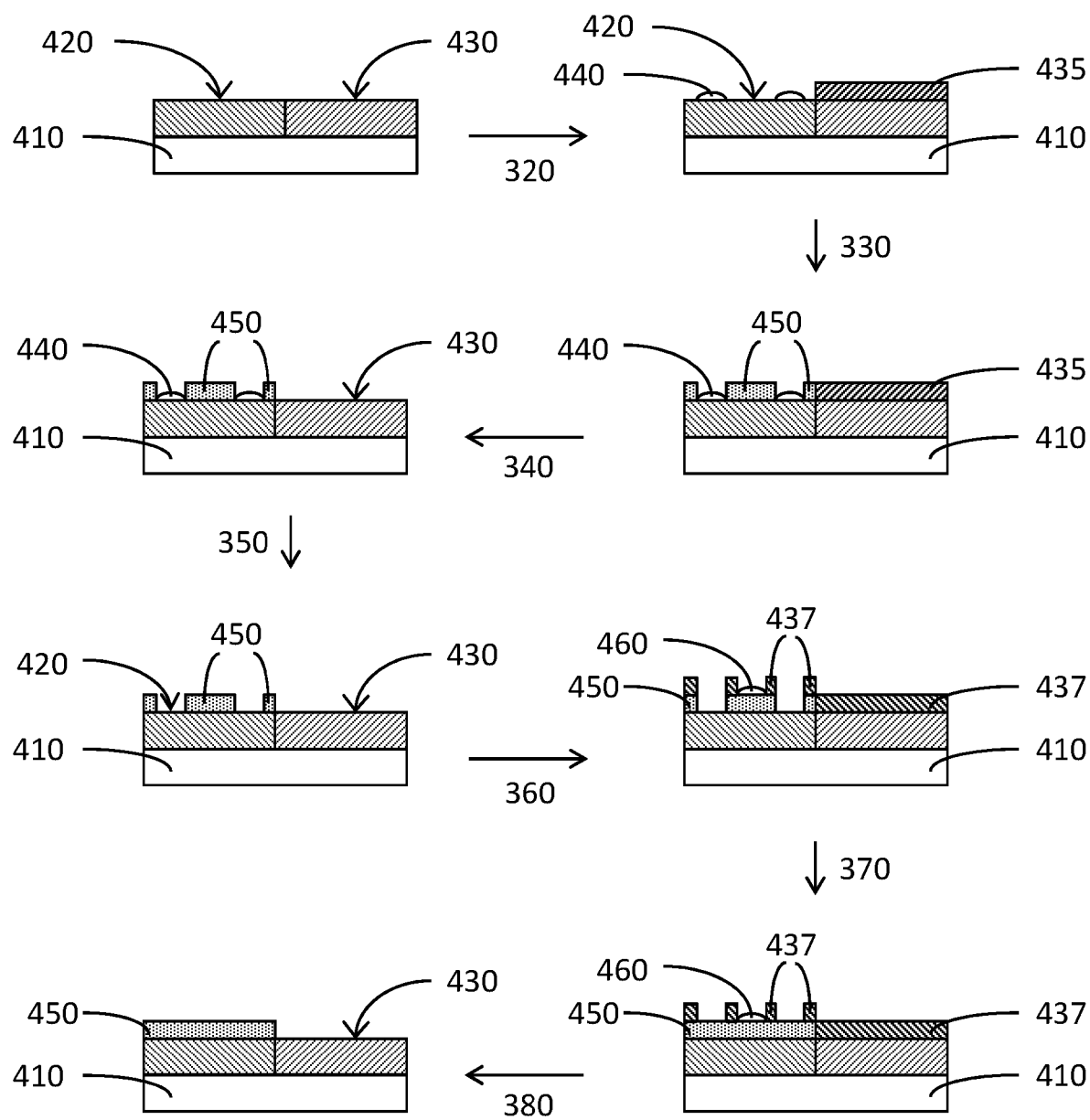
FIG. 4 illustrates a cross sectional view of a substrate as processed through a method in accordance with one or more embodiment of the disclosure.

Referring to FIG. 3, one or more embodiment of the disclosure is directed to a processing method 300 for selective deposition. Referring to FIG. 4, a cross-sectional view of a substrate 410 is shown as it is processed through the processing method 300. At 310, a substrate 410 is provided. The substrate 410 comprises a first surface 420 and a second surface 430. The substrate 410 comprising the first surface 420 and the second surface 430 may also be referred to as a patterned substrate.

The first surface 420 may be comprised of any suitable atomic metal, metal alloy or other conductor. The first surface 420 may also be referred to as a first metal surface. The second surface 430 may be comprised of any suitable dielectric material. The second surface 430 may also be referred to as a second dielectric surface.

At 320, the substrate 410 is exposed to a first SAM molecule (not pictured) to form a first SAM layer 435 on the second surface 430 and first SAM agglomerates 440 on the substrate 410.

In some embodiments, the first SAM layer 435 contains substantially no voids. A void is a gap in the SAM layer where no SAM molecule has reacted with the second surface 430 to inhibit subsequent deposition. As used in this specification and the appended claims, the term "substantially no voids" means that greater than or equal to about 80%, about 85%, about 90%, about 95%, about 98%, about 99% or about 99.5% of the surface area of the second surface 430 is covered by a SAM layer.

The substrate 410 may be exposed to a first SAM molecule by any suitable process. In some embodiments, the substrate 410 is exposed to the SAM molecule by a chemical vapor deposition (CVD) process. In some embodiments, the substrate 410 is exposed to the SAM molecule by an ALD process. In some embodiments, the substrate 410 is exposed to the SAM molecule by an immersion or "wet" process.

In some embodiments, the first SAM agglomerates 440 are formed on both the first surface 420 and the second surface 430. In some embodiments, the first SAM agglomerates 440 are formed only on the first surface 420. In some embodiments, the first SAM agglomerates 440 are formed on the second surface 430.

Next, at 330, the substrate 410 is exposed to a plurality of reactants separately to selectively deposit a dielectric layer 450 on the first surface 420 over the second surface 430. In some embodiments, the plurality of reactants is separated temporally. In some embodiments, the plurality of reactants is separated spatially.

Next, at 340, the first SAM layer 435 is removed from the second surface 430. The first SAM layer 435 can be removed by any suitable process. In some embodiments, the first SAM layer is removed by exposing the substrate 410 to an oxidizing plasma. In some embodiments, the oxidizing plasma comprises oxygen ($O_2$), ozone, water or peroxide. In some embodiments, the oxidizing plasma consists essentially of oxygen ($O_2$). In some embodiments, the oxidizing plasma is generated remotely. In some embodiments, the oxidizing plasma is generated within the processing chamber. In some embodiments, the oxidizing plasma is an inductively coupled plasma (ICP). In some embodiments, the oxidizing plasma is a conductively coupled plasma (CCP).

At 350, the first SAM agglomerates 440 are removed from the substrate 410. The first SAM agglomerates 440 can be removed by any suitable process. In some embodiments, the first SAM agglomerates 440 are removed by an ashing process.

At 360, the substrate 410 is exposed to a second SAM molecule (not pictured) to form a second SAM layer 437 on the second surface 430 and second SAM agglomerates 460 on the substrate 410. In some embodiments, the first SAM molecule and the second SAM molecule are comprised of the same chemical species. In some embodiments, the first SAM molecule and the second SAM molecule are comprised of different chemical species.

In some embodiments, the second SAM layer 437 contains substantially no voids. The substrate 410 may be exposed to a second SAM molecule by any suitable process. In some embodiments, the substrate 410 is exposed to the SAM molecule by a chemical vapor deposition (CVD) process. In some embodiments, the substrate 410 is exposed to the SAM molecule by an ALD process. In some embodiments, the substrate 410 is exposed to the SAM molecule by an immersion or "wet" process.

In some embodiments, the second SAM agglomerates 460 are formed on both the dielectric layer 450 and the second surface 430. In some embodiments, the second SAM agglomerates 460 are formed only on the dielectric layer 450. In some embodiments, the second SAM agglomerates 460 are formed on the second surface 430. In some embodiments, the first SAM agglomerates 440 and the second SAM agglomerates 460 do not overlap the same portions of the substrate 410.

Next, at 370, the substrate 410 is exposed to a plurality of reactants separately to selectively deposit a dielectric layer 450 on the first surface 420 over the second surface 430 and the dielectric layer 450. In some embodiments, the plurality of reactants is separated temporally. In some embodiments, the plurality of reactants is separated spatially.

In some embodiments, at 380, the second SAM layer 437 may be removed to expose the second surface 430, and the second SAM agglomerates 460 are removed from the substrate. The second SAM layer 437 and the second SAM agglomerates 460 may be removed by the same processes or different processes than those used to remove the first SAM layer 435 and the first SAM agglomerates 440.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed is:

1. A method of selective deposition comprising:
   exposing a patterned substrate comprising a first metal surface and a second dielectric surface to a SAM molecule to form a protected second surface and a carbonized layer on the first surface;
   exposing the patterned substrate to an oxygenating agent to remove the carbonized layer from the first surface; and
   exposing the substrate to a plurality of reactants separately to selectively deposit a film on the first surface over the protected second surface.

2. The method of claim 1, wherein the first metal surface comprises one or more of ruthenium or cobalt.

3. The method of claim 1, wherein the patterned substrate is exposed to the SAM molecule by CVD, ALD or immersion.

4. The method of claim 1, wherein the oxygenating agent consists essentially of oxygen.

5. The method of claim 4, wherein the oxygenating agent does not comprise a plasma.

6. The method of claim 1, wherein exposing the substrate to an oxygenating agent occurs at a temperature in the range of about 100° C. to about 350° C.

7. The method of claim 1, wherein exposing the substrate to an oxygenating agent occurs for a period in the range of about 30 seconds to about 10 minutes.

8. The method of claim 1, wherein exposing the substrate to an oxygenating agent occurs at a temperature of about 275° C. for a period of about 1 minute.

9. The method of claim 1, wherein exposing the substrate to an oxygenating agent does not affect the integrity of the protected second surface.

10. The method of claim 1, wherein the film comprises a dielectric material.

11. A method of selective deposition comprising:
- exposing a patterned substrate to a SAM molecule to form a protected second surface and a carbonized layer on the first surface, the patterned substrate comprising a first metal surface comprising ruthenium or cobalt and a second dielectric surface;
- exposing the patterned substrate to oxygen gas at a temperature in the range of about 250° C. to about 300° C. for a period in the range of about 30 seconds to about 2 minutes to remove the carbonized layer from the first surface; and
- sequentially exposing the substrate to a plurality of reactants to selectively deposit a dielectric material on the first surface over the second surface.

* * * * *